United States Patent [19]

Mukaida et al.

[11] 3,976,817

[45] Aug. 24, 1976

[54] METHOD OF PREPARING DIFFUSION TRANSFER IMAGE-RECEIVING MATERIALS

[75] Inventors: Yoshito Mukaida; Masayoshi Tsuboi, both of Asaka, Japan

[73] Assignee: Fuji Photo Film Co., Ltd., Minami-ashigara, Japan

[22] Filed: Aug. 22, 1972

[21] Appl. No.: 282,807

[30] Foreign Application Priority Data

Aug. 25, 1971 Japan............................ 46-64992

[52] U.S. Cl............................. 427/308; 96/76 R; 96/87 R; 427/180; 427/324; 427/307; 427/399

[51] Int. Cl.²...................... B05D 3/10; G03C 1/76

[58] Field of Search............... 96/87 R, 29 R, 76 R, 96/84; 117/47 R, 56, 60, 144, 138.8 UA, 138.8 B, 138.8 F, 34; 117/118, 160 R; 427/307, 308, 324, 399

[56] References Cited
UNITED STATES PATENTS

| | | |
|---|---|---|
| 2,448,861 | 9/1948 | Colt ........................................ 96/38 |
| 2,484,431 | 10/1949 | Staehle et al. ........................... 96/33 |
| 3,078,178 | 2/1963 | Ostberg................................... 117/34 |
| 3,142,582 | 7/1964 | Koretzky et al. ...................... 117/47 |
| 3,179,517 | 4/1965 | Tregillus et al. ....................... 96/29 |
| 3,236,644 | 2/1966 | Gilman et al. .......................... 96/29 |
| 3,245,826 | 4/1966 | Luce et al............................... 117/47 |
| 3,313,625 | 4/1967 | Ryan ....................................... 96/29 |
| 3,607,269 | 9/1971 | Young ..................................... 96/29 |
| 3,671,241 | 6/1972 | Land........................................ 96/29 |
| 3,690,885 | 9/1972 | Krafft et al.......................... 96/29 R |
| 3,704,154 | 11/1972 | Tatsuta et al. ........................ 117/34 |
| 3,711,283 | 1/1973 | Young................................. 96/29 R |
| 3,723,159 | 3/1973 | Tatsuta et al. .................... 117/47 A |
| 3,837,886 | 9/1974 | Tatsuta et al. ........................ 117/34 |

*Primary Examiner*—P.E. Willis, Jr.
*Attorney, Agent, or Firm*—Sughrue, Rothwell, Mion, Zinn and Macpeak

[57] ABSTRACT

A method of preparing a diffusion transfer image-receiving material for use in the silver halide diffusion transfer process which comprises hydrolyzing the surface portion of an alkali non-diffusible polymer sheet and, at the same time as or after the hydrolysis, absorbing diffusion transfer nuclei in the surface portion of the sheet from water, a ketone, or an alcohol containing the diffusion transfer nuclei.

10 Claims, No Drawings

METHOD OF PREPARING DIFFUSION TRANSFER IMAGE-RECEIVING MATERIALS

BACKGROUND OF THE INVENTION

1. Field of the Invention

The present invention is directed to a method of preparing a diffusion transfer image-receiving material and, more paticularly, it is directed to a method of preparing a diffusion transfer image-receiving material by hydrolyzing the surface portion of an alkali non-diffusible polymer sheet to render the surface portion alkali diffusible and absorbing into the sheet silver precipitating nuclei (hereinafter the nuclei are called "diffusion transfer nuclei") from a solvent such as water, a ketone, and an alcohol containing the diffusion transfer nuclei.

2. Description of the Prior Art

A diffusion transfer image-receiving material has been generally prepared by a method in which diffusion transfer nuclei are dispersed in a hydrophilic polymer or an alkali diffusible polymer and applying the dispersion onto a support, or a method in which diffusion transfer nuclei are dispersed in an oleophilic high molecular weight material, the dispersion is dissolved mixed in an organic solvent, the solution is applied to a support, and then the oleophilic high molecular weight material thus coated is hydrolyzed to render the coated layer of the material alkali diffusible (see, e.g., Japanese Pat. No. 32,754/1969).

In the former method, as the hydrophilic high molecular weight material gelatin, polyacrylic acid, a maleic anhydridemethyl methacrylate copolymer, a vinyl derivative (such as polyvinyl alcohol, polyvinyl pyrrolidone, etc.), a cellulose derivative (such as carboxymethyl cellulose, hydroxyethyl cellulose, etc.), the metal salts of these materials, and the alginates of these materials, are used.

However, the image-receiving material prepared by the method has the disadvantages that in the type of diffusion transfer material having a silver halide emulsion layer coated on the image-receiving layer, the silver halide emulsion layer tends to be difficult to separate from the surface of the image-receiving layer, which makes it necessary to provide a specific separating layer between both of the layers; it takes a long period of time to dry the image-receiving layer after washing the diffusion transferred image-receiving layer with water; the surface of the image-receiving layer retains a sticky feeling even after drying; and also the silver image obtained by the diffusion transfer process is weak mechanically or chemically.

In the latter method a material to be used as the diffusion transfer nuclei is absorbed in an oleophilic polymer using vacuum evaporation, the oleophilic polymer containing the material is dissolved in a solvent which does not dissolve the diffusion transfer nuclei, and after forming a layer of the oleophilic polymer from the solution, the polymer layer containing the diffusion transfer nuclei is chemically treated. Thus, the diffusion transfer nuclei are dispersed throughout the entire layer of the alkali diffusible material.

However, this method is also accompanied by the following difficulies. First, although the techniques for vacuum evaporation are considerably developed at present, it is still technically difficult to obtain a constant condition for producing the diffusion transfer nuclei in the case of preparing a large amount of the nuclei for such a purpose as in this method. Also, as described above, in this method the surface portion of the layer of an alkali non-diffusible polymer prepared by incorporating a material used as the diffusion transfer nuclei in the alkali non-diffusible polymer by vacuum evaporation, dissolving the alkali non-diffusible polymer containing the nuclei in an oganic solvent, and applying the solution to a support is provided with an alkali diffusible property by hydrolysis. In this case, however, the diffusion transfer nuclei present in only the alkali diffusible surface portion of the layer are effectively utilized in the diffusion transfer process but the diffusion transfer nuclei present in other portions of the layer, that is, in the alkali non-diffusible portions of the layer are present for no purpose. Furthermore, by hydrolyzing the alkali non-diffusible polymer layer containing the diffusion transfer nuclei, the nuclei contained in the layer are decreased in activity as the silver precipitating agent at diffusion transfer.

An object of this invention is, therefore, to provide a diffusion transfer image-receptive material having excellent properties unaccompanied by the above-described difficulties.

SUMMARY OF THE INVENTION

The present invention provides a method of preparing a diffusion transfer image-receiving material which comprises hydrolyzing the surface portion of an alkali non-diffusible polymer sheet and subsequent to the hydrolysis absorbing diffusion transfer nuclei in at least a part of the surface portion from a solution or a dispersion of the diffusion transfer nuclei in a solvent selected from the group consisting of water, a ketone, an alcohol, and a mixture of these solvents.

DETAILED DESCRIPTION OF THE INVENTION

In the present invention the term "alkali non-diffusible portion" is intended to describe the portion in which a diffusion transfer developing solution using water as the main solvent diffuses with difficulty and the term "alkali diffusible portion" is intended to describe that portion in which a diffusion transfer developing solution using water as the main solvent diffuses within the period of time ordinarily used in development, e.g., shorter than 15 minutes at 20°C.

The image-receiving material can be prepared by the following various embodiments, embodiment (3) being the particular embodiment of this invention:

Method 1: The surface portion of an alkali non-diffusible polymer layer is converted into the alkali diffusible portion by treating the surface and then the diffusion transfer nuclei are absorbed in the alkali diffusible surface portion using a dipping bath or coating.

Method 2: The surface portion of an alkali non-diffusible polymer layer is treated with a solution containing the diffusion transfer nuclei together with a treating agent capable of converting the alkali non-diffusible portion into the alkali diffusible portion whereby the surface portion of the layer is rendered alkali diffusible and at the same time the diffusion transfer nuclei are absorbed in the surface portion of the polymer layer.

Method 3: The surface portion of an alkali non-diffusible polymer layer is treated with a solution or a dispersion of the diffusion transfer nuclei in an organic solvent which is capable of swelling the alkali non-diffusible polymer layer such as methylene chloride, methyl alcohol, ethyl alcohol, an ethylene glycol alkyl ether and the like to absorb the diffusion transfer nuclei in the surface portion and then the surface portion is rendered alkali diffusible by treating the surface portion with another solution.

Actually, as previously mentioned, the method which forms the basis of the present invention is method (3) above.

The above methods are advantageous over the conventional vacuum deposition method in that the distribution and the concentration of the nuclei in the alkali diffusible surface portion of the alkali non-diffusible polymer sheet can easily be controlled.

Examples of suitable alkali non-diffusible polymers which can be used in this invention are an organic acid ester of cellulose such as cellulose diacetate, cellulose triacetate, a mixture of these acetates, cellulose acetate, cellulose propionate, cellulose butyrate, cellulose acetate butyrate, etc.; an inorganic acid ester of cellulose such as cellulose nitrate; polyethylene terephthalate; polystyrene; a polyvinyl ester such as polyvinyl acetate; a polyvinyl acetal such as polyvinyl acetal; and the like.

The surface portion of a layer of the alkali non-diffusible material as described above can be rendered alkali diffusible using various known techniques. For example, the surface of the cellulose ester layer can be rendered alkali diffusible by hydrolyzing the surface portion with an alkali. The hydrolysis of the surface portion of layer can be practiced by the method as disclosed in the specification of U.S. Pat. No. 2,448,861 wherein the layer of the alkali non-diffusible material is immersed in a solution containing 50 g/liter of sodium hydroxide and 400 g/liter of ethanol or by the method disclosed in the specification of U.S. Pat. No. 3,078,178 wherein the surface of the layer of the alkali non-diffusible material is treated with a 50 : 50 aqueous methanolic solution containing 300 g/liter of sodium hydroxide. Suitable alkali materials which can be used are sodium hydroxide, lithium hydroxide, ammonium hydroxide and sodium carbonate.

In other case, for example, in the case of using the polyvinyl acetal as the alkali non-diffusible material, the surface of the layer can be rendered alkali diffusible by an acid hydrolysis, e.g., with hydrochloric acid, nitric acid, sulfuric acid, phosphoric acid, acetic acid and benzene sulfonic acid. The surface portion of the layer of polyethylene terephthalate or polystyrene can be modified using bichromic acid, sulfuric acid or nitric acid or can be oxidized using ozone or a high frequency wave discharge. It will further be clearly understood by persons skilled in the art that these methods can be easily operated and also appropriate reaction conditions can be easily determined or selected.

Examples of the material which can be used as the diffusion transfer nuclei in this invention are heavy metals such as cadmium, tin, zinc, chromium, nickel, cobalt, etc.; other heavy metals such as the noble metals of gold, silver, platinum, palladium, etc.; the sulfides or selenides of these heavy metals; and derivative compounds of these noble metals such as tellurides, and oxides (e.g., $As_2O_3$) as well as complex salts such as thioacetamide, thiobiuret and the like, as disclosed, for example, in U.S. Pat. Nos. 2,352,014, 2,740,717 and 3,020,155. Such materials can be introduced in the alkali diffusible surface portion of a layer of the alkali non-diffusible polymer by immersing the surface portion thereof in a solution of the material after rendering the surface portion of the layer alkali diffusible as shown in the Method 1 referred to above. Also, the material may be introduced in the alkali diffusible surface portion of the layer simultaneously when the surface portion is rendered alkali diffusible as shown in the Method 2 previously referenced. The material such as the noble metal, a sulfide or selenide of the heavy metal, or silicon dioxide can be introduced in the alkali diffusible surface portion of the layer of the alkali non-diffusible polymer by rendering alkali diffusible the surface portion of the alkali non-diffusible polymer layer and then treating the surface of the surface portion with a colloid solution of the material or by applying the colloid solution of the material onto the surface portion. Still further, the surface portion of the alkali non-diffusible polymer layer can be treated with a colloid solution containing the diffusion transfer nuclei and capable of hydrolyzing the surface portion thereof to render the surface portion alkali diffusible and at the same time to introduce the diffusion transfer nuclei into the surface portion.

Moreover, as shown in Method 3 indicated above, the material used as the diffusion transfer nuclei is dissolved or colloidally dispersed in a solution capable of swelling the surface portion of the layer of the alkali non-diffusible material, the surface portion of the alkali non-diffusible layer is immersed in the solution or dispersion and after lightly washing the surface portion with water, the surface portion containing the diffusion transfer nuclei is rendered alkali diffusible using known methods.

In the case of dispersing the diffusion transfer nuclei as described above, a smalll proportion of a high molecular weight material can be incorporated in the dispersion to promote the dispersion of the nuclei. Because, in such a case, the high molecular weight material is not used after the polymer sheet is immersed in the dispersion or coated with the dispersion, the high molecular weight material is removed from the sheet by washing.

The solvent used for the hydrolysis of the surface of the alkali non-diffusible polymer layer has preferably the ability to swell or soften the alkali non-diffusible material, even if this property is only slight. For instance, water is used as the main solvent in the case of hydrolyzing the layer of cellulose derivative, but an alcohol, a ketone, or a chlorinated hydrocabon having a large ability to swell or soften the cellulose derivative can be used individually or as a mixture thereof or with water. Other solvents having the above ability include dioxane, ethyleneglycol alkyl ethers (cellosolve).

Examples of suitable alcohols include methanol, ethanol, propanol, iso-propanol, butanol, ethylene glycol, propylene glycol, polyethylene glycol, and the like.

Examples of suitable ketones used in the hydrolysis are acetone, methyl ethyl ketone, methyl isobutyl ketone, and the like.

In particular, a mixture of water and methanol, water and ethanol, water and propanol, water and ethylene glycol, or water, methanol, and acetone is preferably used from the standpoint of promoting the hydrolysis and controlling the conditions for the hydrolysis. Of course, the alkali non-diffusible polymer layer can be simply dipped in water or the aforesaid solvent as a pre-treatment bath prior to conducting the hydrolysis and in some cases, the treatment in such a pre-treatment bath is effective for preventing the generation of static electricity and for washing away dust from the surface of the layer.

As the solvents for hydrolyzing the layer of polystyrene, polyvinyl acetal, polyvinyl acetate, etc., water, the alcohols, and the ketones as described above can also be used. In general, the solvent used for hydrolyzing the surface of the alkali non-diffusible material may contain a strong swellling agent such as dioxane, methyl cellosolve, dimethyl formamide, and dimethyl acetamide.

In the practice of hydrolysing the alkali non-diffusible material, an acid or an alkali is incorporated in the solvent as described above. Suitable acids which can be used include inorganic acids such as hydrochloric acid, nitric acid, sulfuric acid, and phosphoric acid and organic acids such as acetic acid and benzenesulfonic acid. They can be used alone or as mixtures thereof. Suitable alkalis include sodium hydroxide, lithium hydroxide, ammonium hydroxide, and sodium carbonate——and they can also be used alone or as mmixtures thereof. An organic salt or an inorganic salt can be incorporated in the solvent together with the acid or the alkali for restraining or controlling the swelling of the alkali non-diffusible material at hydrolysis.

When the diffusion transfer nuclei are absorbed in the surface portion of the alkali non-diffusible layer simultaneously when the surface portion is hydrolyzed, the preferred conditions for the hydrolysis are sometimes determined by the nature of the diffusion transfer nuclei. For instance, when a sulfide of a metal is used as the diffusion transfer nuclei, the sulfide of the metal is more stable if present in an alcohol or in a mixed solvent system containing a ketone than in a system using water as the solvent. Also, because the colloid of the metal sulfide is more stable if present when the pH of the solution containing the diffusion transfer nuclei is in an alkaline range than when the pH thereof is in an acid range, it is more preferable to hydrolyze the surface portion of the layer of the alkali non-diffusible material in an alkaline solvent system containing the colloid of the metal sulfide. In particular, if the colloid material used as the diffusion transfer nuclei tends to be readily oxidized in the solvent solution, the oxidation of the colloid material can be retarded by introducing a non-oxidizing gas, such as a nitrogen gas, an argon gas, or a carbon dioxide gas, into the solution.

When the surface portion of the layer of the alkali non-diffusible material is rendered alkali diffusible or converted into an alkali diffusible portion, the thickness of the surface portion to be hydrolyzed depends upon the nature of the alkali non-diffusible material, the composition of the solvent system for hydrolysis, the concentration of the alkali or the acid, the reaction temperature, and the reaction period of time. The reaction temperature is generally in a range of 10° to 80°C, but the temperature is preferably in a range of 25° to 60°C for conducting the reaction smoothly and in a short length of time.

According to the process of this invention for preparing the diffusion transfer image-receiving materials, the diffusion transfer nuclei are absorbed in the surface portion of the layer of the alkali non-diffusible material from a solution of the material to be used as the diffusion transfer nuclei or a colloidal dispersion of the nuclei material, the distribution of the nuclei in the surface portion thereof is uniform in the planar directions, but the distribution of the diffusion transfer nuclei and also the proportion of the alkali diffusible portion vary gradually in the direction of depth of the polymer sheet and there is no clear interface between the alkali diffusible portion and the alkali non-diffusible portion. Accordingly, there is no difficulty in separating the alkali diffusible surface portion from the alkali non-diffusible portion, which usually occurs in the conventional diffusion transfer image-receiving material prepared by coating an alkali diffusible layer on an alkali non-diffusible layer.

Also, because the silver image formed by utilizing the diffusion transfer nuclei or by a diffusion transfer process is mainly present in the surface portion of the image-receiving layer and the proportion of the silver image formed on the surface of the surface portion is less, the silver image is hardly removed by rubbing or friction. In the aforesaid Method 2 in which the surface portion of the layer of the alkali non-diffusible material is treated with a solution capable of hydrolyzing the alkali non-diffusible material and containing the diffusion transfer nuclei, the hydrolyzed surface portion of the layer contains the diffusion transfer nuclei and thus when a silver image is formed by a diffusion transfer photographic developing process, the silver image can be formed deeply into the surface portion of the layer. Therefore, when an etching bleach is applied to the image-having surface portion of the layer utilizing the silver image as the catalyst nuclei, even the deep portion of the surface portion having the silver image therein is degraded and becomes easily removable.

Thus, the features of the present invention are that only the surface portion of the alkali non-diffusible polymer layer is alkali diffusible, the diffusion transfer nuclei are present in only the alkali diffusible surface portion and are not present throughout the entire layer of the alkali non-diffusible portion.

Thus, the alkali non-diffusible polymer layer acts as a waterproof layer and further the diffusion transfer image-receiving sheet can also be used as an offset printing plate by utilizing the hydrophilic properties of the alkali diffusible layer and the ink receptive properties of the alkali non-diffusible layer.

Furthermore, another feature of the present invention is that the material to be used as the diffusion transfer nuclei is introduced in the surface portion of the alkali non-diffusible layer from a solution of the material or a colloid dispersion of the material and thus the use of a specific means such as vacuum evaporation is unnecessary.

As described above, the image-receiving material prepared by the process of this inventon is particularly useful for producing a specific product by utilizing a diffusion transfer photographic process.

A further feature of the present invention is that because in the process of this invention the surface portion of the layer of the alkali non-diffusible material is converted into an alkali diffusible portion and at the same time or thereafter a material to be used as the diffusion transfer nuclei is absorbed in this surface portion, there is no distinct interface between the alkali diffusible portion and the alkali non-diffusible portion, i.e., the nature of the surface portion of the alkali non-diffusible layer varies gradually and continuously and, thus, no difficulties in stripping the surface layer as in the case of forming the surface layer by coating occurs. Futhermore, the diffusion transfer nuclei are mainly present in the surface portion which is alkali diffusible and thus the silver image formed near the diffusion transfer nuclei by a diffusion transfer process is hardly removed by rubbing.

In particular, when the method shown in the above-described Method 1 or 2 is employed rendering the surface portion alkali diffusible and containing the diffusion transfer nuclei, a chemical treatment for converting the layer to an alkali diffusible condition as in the invention of Japanese Pat. No. 32,754/1969 (which corresponds with U.S. patent application Ser. No. 437,799 of Mar. 8, 1965 which was abandoned in favor of U.S. patent application Ser. No. 675,472 of Oct. 16, 1975 (now U.S. Pat. No. 3,671,241) which latter application was then followed by U.S. patent application Ser. No. 264,256 of June 19, 1972 (now U.S. Pat. No. 3,772,025)) is unnecessary and accordingly no reduction in activity of the nuclei material will occur.

The image-receiving material prepared by the process of this invention may be coated with a silver halide emulsion and in this case an appropriate separating layer may be applied to the surface of the image-receiving layer or a silver halide emulsion capable of being readily separated after development may be used. For instance, a gelatino silver halide emulsion in which the gelatin has not been cross-linked by using hardening agents or a silver halide emulsion containing cellulose acetate hydrogen phthalate as the binder may be used, or a synthetic resin layer or a natural polymer layer with or without pigments may be present between the image-receiving layer and the silver halide emulsion layer.

By subjecting the diffusion transfer image-receiving layer having the silver halide emulsion layer coated thereon to a diffusion transfer developing process after image-wise exposure or pressing the surface of a silver halide emulsion layer formed on a support in contact with the surface of the image-receiving layer prepared by the process of this invention and subjecting the laminate to a diffusion transfer developing process after image-wise exposure, the image-receiving layer prepared by the process of this invention mat be utilized for various purposes such as for black and white films, black and white prints, color prints, print wiring patterns, and masters for thermographic transfer processes.

The image-receiving material prepared by the process of this invention may be used as a master for lithographic printing. As an example of this utilization, the image-receiving material thus prepared by the process of the present invention is subjected to a diffusion transfer process to form a positive image of an original in the surface portion of the layer and then the image-receiving layer is processed in a solution having the following composition, whereby the silver image is bleached and at the same time the alkali diffusible polymer near the silver image is degraded and can be easily removed (this process is called "etching bleach").

| Example of Etching Bleach Solution: | |
|---|---|
| Cupric Chloride | 50 g |
| Citric Acid | 50 g |
| Hydrogen Peroxide Solution (30%) | 500 ml |
| Water to make 10 liters. | |

Thus, when the alkali diffusible polymer portion is removed in conformity with the silver image by the etching bleach to expose the surface of the alkali non-diffusible polymer layer at the portions removed, the product can be used as the master for lithograhic printing since the exposed surface of the alkali non-diffusible polymer has higher ink receptive properties than the non-image alkali non-diffusible polymer layer.

Furthermore, the image-receiving material prepared by the process of this invention may be utilized as the master for overhead projector use. That is to say, when the image-receiving material is subjected to a diffusion transfer process to form a silver image in the alkali diffusible surface portion, the product can be used as the master for an overhead projector as it is, and further, when the image-receiving material thus processed is further processed with an etching bleach solution as used for preparing the master for lithographic printing, a relief image is formed and the product having the relief image can also be employed as the master for overhead projector use.

The disclosure will now be explained in greater detail by reference to the following examples. Unless otherwise specified all parts and percents are by weight.

EXAMPLE 1

Colloidal nickel sulfide (0.5 wt% nickel sulfide in an aqueous gelatin solution) was formed in a 2.0 % gelatin solution and then 15 g of the gelatin solution was mixed with 600 g of water, 150 g of potassium hydroxide, and 400 g of methanol of 40°C. A sheet of cellulose acetate butyrate (Type 161–40, a trade name, made by Eastman Kodak Co.) having a thickness of 100 microns was immersed in the mixture prepared above for 90 seconds at 50°C, thereby the surface portion of the sheet was hydrolyzed and at the same time the diffusion transfer nuclei were introduced into the surface portion. Thereafter, the sheet was washed with water and dried to give a diffusion transfer image-receiving sheet.

A silver chlorobromide emulsion (80% silver chloride) containing 1 mol of silver per kilogram of emulsion was applied to the surface of the image-receiving sheet in a thickness of 4 microns. The silver halide emulsion layer was exposed to an original and developed in a developing solution having the following composition for 30 seconds at 20°C.

| Developing Solution: | |
|---|---|
| Water | 750 ml |
| p-Methylaminophenol Sulfate | 5 g |
| Anhydrous Sodium Sulfite | 65 g |
| Hydroquinone | 15 g |
| Anhydrous Sodium Thiosulfate | 15 g |
| Sodium Hydroxide | 20 g |
| Water added to make 1000 ml. | |

By removing the silver halide emulsion layer with water at 50°C, a positive image was obtained.

EXAMPLE 2

A cellulose butyrate sheet having a thickness of 50 microns was laminated to a high-quality paper at 75 g/m² and then polyethylene was applied to the back surface thereof in a thickness of 40 l microns. The sheet thus prepared was immersed in a solution having the following composition for 2 minutes at 45°C to hydrolyze the surface portion of the cellulose butyrate sheet.

| | |
|---|---|
| Water | 400 g |
| Ethanol | 500 g |

| | |
|---|---|
| Ethylene Glycol | 100 g |
| Lithium Hydroxide | 90 g |

Then, a 0.06% methanol solution of nickel chloride (hexa-hydrate) was applied to the surface of the cellulose butyrate sheet thus processed. After drying, the sheet was immersed in a 0.5% aqueous solution of sodium sulfide (nona-hydrate), washed with water, and dried to provide a transparent diffusion transfer image-receiving material. The image-receiving layer was placed on a silver halide emulsion layer formed by applying a silver chloride emulsion containing silver and gelatin in a ratio of 1 : 2 to a support and exposed to an original with the developing solution having the same composition as described in Example 1 present between both surfaces and after 40 seconds from that point, the image-receiving material was separated from the silver halide emulsion layer, whereby a black positive silver image was formed.

EXAMPLE 3

A cellulose triacetate sheet having a thickness of 125 microns was hydrolyzed in a solution having the following composition for 6 minutes at 20°C.

| | |
|---|---|
| Water | 500 g |
| Methanol | 500 g |
| Potassium Hydroxide | 70 g |

The sheet of which the surface portion had been hydrolyzed was neutralized with a 5 % aqueous solution of acetic acid, washed with water, and dried. The sheet was then immersed in a 0.03% methanol solution of chloroauric acid for 30 seconds and dried. It is preferable to irradiate the sheet by ultraviolet rays at drying, but when the sheet thus processed was allowed to stand for one day at a normal temperature, a sufficient amount of the diffusion transfer nuclei were formed in the surface portion of the cellulose triacetate sheet, said surface portion having been hydrolyzed. Thus, a diffusion transfer imge-receiving material was prepared. A silver chlorobromide emulsion (70% silver chloride) containing 1 mol of silver per kilogram of emulsion was applied to the surface of the image-receiving layer in a thickness of 3 microns. Also, an antihalation layer was formed on the opposite surface of the support to the image-receiving layer side. The photosensitive emulsion layer was exposed to an original in a platemaking camera for 15 seconds at $f = 22$ and then developed in a diffusion transfer developing solution having the following composition for 30 seconds at room temperature (22°C).

| Developing Solution: | |
|---|---|
| Water | 1000 g |
| Sodium Sulfite | 80 g |
| Hydroquinone | 30 g |
| Sodium Thiosulfate | 15 g |
| Sodium Hydroxide | 25 g |
| Potassium Bromide | 3.0 g |
| 0.5% Aqueous Solution of Benzotriazole | 25 g |

Then, by separating the silver halide emulsion layer from the image-receiving layer in water of 50°C, a positive having a black silver image was obtained.

Example 4

| Composition A: | |
|---|---|
| Glycerol | 50 ml |
| Methanol | 300 ml |
| Sodium Sulfide (nona-hydrate) | 1.2 g |
| Sodium Carbonate (mono-hydrate) | 0.2 g |
| Water | 10 ml |
| Composition B: | |
| Cadmium Acetate (di-hydrate) | 13.3 g |
| Water | 10 ml |

The solution having the Composition B was added with stirring to the solution having the Composition A over a period of 5 minutes to give a Solution C having cadmium sulfide dispersed therein.

100 g of the Solution C was mixed with a solution having the following Composition D to give a Solution E.

| Composition D: | |
|---|---|
| Water | 800 ml |
| Sodium Hydroxide | 200 ml |
| Methanol | 1200 ml |

A cellulose triacetate sheet having a thickness of 135 microns was immersed in the Solution E prepared above for 40 seconds at 40°C, washed with warm water, and dried. Thus, a diffusion transfer image-receiving sheet was obtained. A silver iodobromide emulsion (5% silver iodide) containing 1.2 mol of silver per kilogram of emulsion and orthochromatically sensitized with a carbocyanine sensitizing dye was applied to the image-receiving layer in a thickness of 5 microns.

The silver halide emulsion layer was exposed to an original and developed in the developing solution as described in Example 1 for 40 seconds at 25°C. Thereafter, by removing the silver halide emulsion layer with warm water at 45°C, a positive silver imagea was obtained. The sheet having the silver image could be used as a master in an overhead projector.

EXAMPLE 5

A polystyrene sheet having a thickness of 120 microns was immersed in concentrated sulfuric acid for 10 seconds at 50°C to sulfonate the surface portion thereof and after washing with water, the sheet was immersed in 1 N aqueous sodium hydroxide solution to neutralize the acid. Then, the sheet was washed with water and dried. The sheet, then, was immersed in a dispersion of colloidal nickel sulfide formed in a mixture of 80 g of ethylene glycol monobutyl ether, 15 g of methanol, and 5 g of water for 60 seconds at 30°C to absorb the nickel sulfide in the surface portion. By processing the diffusion transfer image-receiving material thus prepared as described in Example 1, a black positive silver image was formed.

EXAMPLE 6

A cellulose triacetate sheet having a thickness of 155 microns was immersed in the Solution I prepared by the following manner for 60 seconds at 40°C, whereby the surface portion of the sheet was hydrolyzed to render the surface hydrophilic and simultaneously absorb nickel sulfide in the surface portion. Thus, a diffusion transfer image-receiving sheet was prepared.

| Composition F | |
|---|---|
| Glycerol | 100 g |
| Ammonium Sulfide (aqueous solution containing 14.3% sulfur) | 30 ml |
| Composition G | |
| Glycerol | 180 g |
| Nickel Chloride (hexa-hydrate) | 0.3 g |

A solution of the Composition F was mixed with a solution of the Composition G with stirring at 30°C over a period of 5 minutes to give a Solution H. The Solution I used above was prepared by mixing 250 g of the Solution H and a solution consisting of 3000 g of methanol, 2000 g of water, and 500 g of sodium hydroxide.

Then, a silver chlorobromide emulsion (70% silver chloride) containing 1 mol of silver per kilogram of emulsion and having been subjected to a gold sensitization using a rhodan salt and a potassium aurichloride and an orthochromatic sensitization with a merocyanine sensitizing dye was applied to the diffusion transfer image-receiving sheet in a thickness of 4 microns.

The silver halide emulsion layer was exposed to an original, developed in the developing solution as described in Example 1 for 30 seconds at 15°C, and then the silver halide emulsion layer was removed with warm water at 50°C to give a positive silver image.

The sheet having the silver image was processed in a solution having the following composition for 30 seconds at 20°C.

| Composition | |
|---|---|
| Cupric Chloride | 20 g |
| Citric Acid | 40 g |
| Water | 900 g |
| 3% Hydrogen Peroxide Solution | 500 g |

The sheet was then washed with water, whereby the cellulose or the cellulose derivative near the silver image was degraded. By removing the degraded portions by rubbing with a sponge an offset printing plate was obtained. An offset ink attached to only the portions having the silver image and the portions near the silver image but did not attach to the non-image portions. By using commercially available wetting water and an offset ink, more than 10,000 sheets of high quality prints were obtained from the offset printing plate.

EXAMPLE 7

A cellulose triacetate film having a thickness of 155 microns was immersed in a solution having the following composition for 45 seconds at 35°C to absorb the diffusion transfer nuclei into the surface portion of the film.

| Composition | |
|---|---|
| Glycerol Solution Containing Nickel Sulfide* | 155 g |
| Methanol | 3000 g |

*The solution was prepared by dissolving 15 ml of aqueous ammonium sulfide in 50 g of glycerol and dissolving 90 g of a glycerol solution of 0.5% nickel chloride in the solution.

After washing and drying, the film was immersed in a hydrolyzing solution for 30 seconds at 35°C to hydrolyze the surface portion of the cellulose triacetate film containing the diffusion transfer nuclei. By washing the film with water followed by drying, a positive image-receiving material was prepared. When the image-receiving film was subjected to a diffusion transfer development in the same manner as described in Example 2, a black positive silver image was obtained.

On the other hand, when an image-receiving film was prepared in the same way as described above without applying, however, the hydrolysis and subjected to the same diffusion transfer development as in the above process, no silver image was obtained.

While the invention has been described in detail and in terms of specific embodiments thereof, it will be apparent to one skilled in the art that various changes and modifications can be made therein without departing from the spirit and scope thereof.

What is claimed is:

1. A method of preparing a diffusion transfer image-receiving material for use in a silver halide diffusion transfer process which consists of contacting the surface portion of an alkali non-diffusible sheet composed of a polymer selected from cellulose diacetate, cellulose triacetate, a cellulose butyrate, or a mixture of cellulose esters, with a solution or a dispersion of diffusion transfer nuclei in an organic solvent consisting of alcohols, ketones, ethylene glycol, ethers, or a solvent mixture of said solvents and water, which is capable of swelling the alkali non-diffusible polymer layer to absorb said nuclei in said surface portion, and then contacting said surface portion containing said diffusion transfer nuclei with a solvent containing an alkai or an acid to render said surface portion alkali diffusible.

2. The method of preparing a diffusion transfer image-receiving material as set forth in claim 1, wherein said surface is rendered alkali diffusible by contacting with a solvent selected from the group consisting of water, an alcohol, a ketone and mixtures thereof, said solvent containing an acid selected from the group consisting of hydrochloric acid, nitric acid, sulfuric acid, phosphoric acid, bichromic acid, and benzenesulfonic acid.

3. The method of preparing a diffusion transfer image-receiving material as set forth in claim 1, wherein said polymer is selected from a mixture of cellulose acetate butyrate, cellulose butyrate, and cellulose triacetate.

4. The method of preparing a diffusion transfer image-receiving material as set forth in claim 1, wherein said diffusion transfer nuclei are selected from the group consisting of a heavy metal, a heavy metal sulfide, a heavy metal selenide, a heavy metal telluride, and a heavy metal oxide.

5. The method of preparing a difusion transfer image-receiving material as set forth in claim 1, wherein said diffusion transfer nuclei are selected from the group consisting of nickel sulfide, gold metal, and cadmium sulfide.

6. The method of claim 5, wherein said diffusion transfer nuclei are nickel sulfide.

7. The method of preparing a diffusion transfer image-receiving material as set forth in claim 1, wherein said alcohol is selected from the group consisting of methanol, ethanol, propanol, isopropanol, butanol, ethylene glycol, propylene glycol, and polyethylene glycol.

8. The method of preparing a diffusion transfer image-receiving material as set forth in claim 1, wherein said ketone is selected from the group consisting of acetone, methyl ethyl ketone, and methyl isobutyl ketone.

9. The method of preparing a diffusion transfer image-receiving material as set forth in claim 1, wherein said solvent is selected from the group consisting of a water-methanol mixture, a water-ethanol mixture, a water-propanol mixture, a water-ethylene glycol mixture, and a water-methanol-acetone mixture.

10. The method of preparing a diffusion transfer image-receiving material as set forth in claim 1, wherein said surface is rendered alkali diffusible by contacting with a solvent selected from the group consisting of water, an alcohol, a ketone, and mixtures thereof, said solvent containing an alkali material selected from the group consisting of sodium hydroxide, lithium hydroxide, ammonium hydroxide, and sodium carbonate.

* * * * *